(12) United States Patent
Deguchi

(10) Patent No.: US 11,296,594 B2
(45) Date of Patent: Apr. 5, 2022

(54) FAILURE PREDICTION SYSTEM

(71) Applicant: DENSO CORPORATION, Kariya (JP)

(72) Inventor: Masataka Deguchi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 163 days.

(21) Appl. No.: 16/750,262

(22) Filed: Jan. 23, 2020

(65) Prior Publication Data
US 2020/0274437 A1 Aug. 27, 2020

(30) Foreign Application Priority Data
Feb. 27, 2019 (JP) .............................. JP2019-034672

(51) Int. Cl.
*H02M 1/32* (2007.01)
*G01R 31/40* (2020.01)
*G06N 20/00* (2019.01)

(52) U.S. Cl.
CPC .............. *H02M 1/32* (2013.01); *G01R 31/40* (2013.01); *G06N 20/00* (2019.01)

(58) Field of Classification Search
CPC ........ H02M 1/32; H02M 1/327; G06N 20/00; G01R 31/40
See application file for complete search history.

(56) References Cited

U.S. PATENT DOCUMENTS

| | | | | |
|---|---|---|---|---|
| 10,354,462 | B1* | 7/2019 | Zhang | G07C 5/0808 |
| 2008/0285192 | A1* | 11/2008 | Phadke | H02M 1/32 361/86 |
| 2013/0328596 | A1* | 12/2013 | Zoels | H03K 17/18 327/109 |
| 2017/0293862 | A1 | 10/2017 | Kamiya et al. | |
| 2021/0021227 | A1* | 1/2021 | Kimura | H02M 1/32 |

FOREIGN PATENT DOCUMENTS

| | | |
|---|---|---|
| JP | 2015-146658 A | 8/2015 |
| JP | 2017-188030 A | 10/2017 |

* cited by examiner

*Primary Examiner* — Manuel L Barbee
(74) *Attorney, Agent, or Firm* — Oliff PLC

(57) ABSTRACT

A failure prediction system disclosed herein is configured to predict a failure of a power converter which converts output power of a power source to power for driving a traction motor. The system may include: a sensor provided at the power converter; and a controller configured to predict a failure of the power converter based on a measurement value of the sensor. The controller may be configured to: calculate a difference between previous and present measurement values of the sensor, wherein the controller repeatedly calculates the difference at predetermined time intervals; obtain intermediate data by applying variable conversion to a plurality of the past differences; calculate a damage level of the power converter based on the intermediate data; and output a warning signal in a case where the damage level exceeds a damage threshold, wherein the warning signal indicates that a timing when the failure occurs is approaching.

5 Claims, 21 Drawing Sheets

| Bin Number | Temperature Range (Bin Width) | Number of Occurrences | Reference Value |
|---|---|---|---|
| bin1 | $A1 \leqq dT < A2$ | B1 | C1 |
| bin2 | $A2 \leqq dT < A3$ | B2 | C2 |
| bin3 | $A3 \leqq dT < A4$ | B3 | C3 |
| bin4 | $A4 \leqq dT < A5$ | B4 | C4 |

FIG. 10

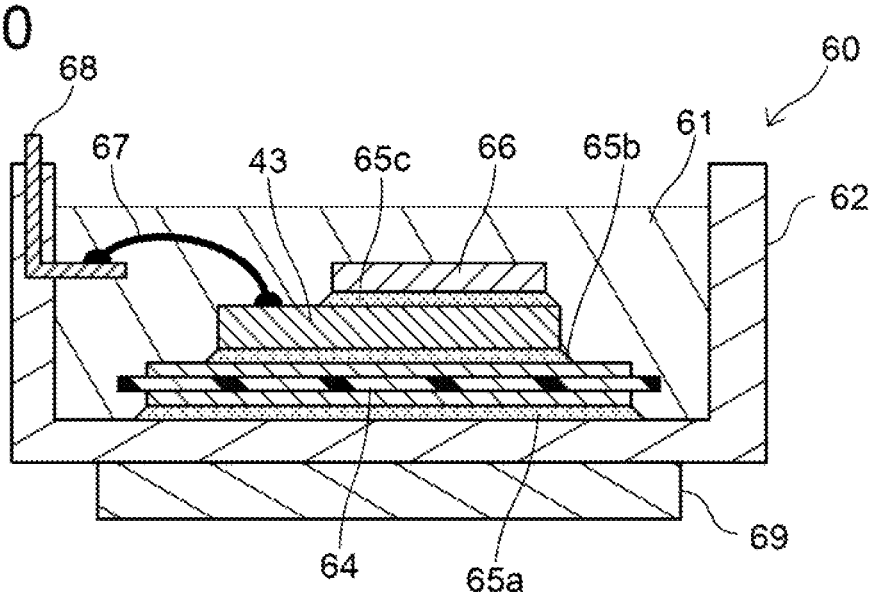

FIG. 11

| Subject Parts | Sign Prediction Items |
|---|---|
| Power Semiconductor Element | Element Deformation |
| | Breakage of Element Electrode |
| | Change in Element Characteristics (Diode Characteristics) |
| Power Card | Breakage of Wire Bonds |
| | Wear of Bonding Material |
| | Electromigration in Plating |
| Heat Dissipating Material | Deterioration, Quality Change, and Defects in Heat Dissipating Material |
| Cooler | Decrease in Cooling Performance (Pump Failure) |
| | Clog in Cooling System (Decrease in Flow Rate of Cooling Medium) |

FIG. 13
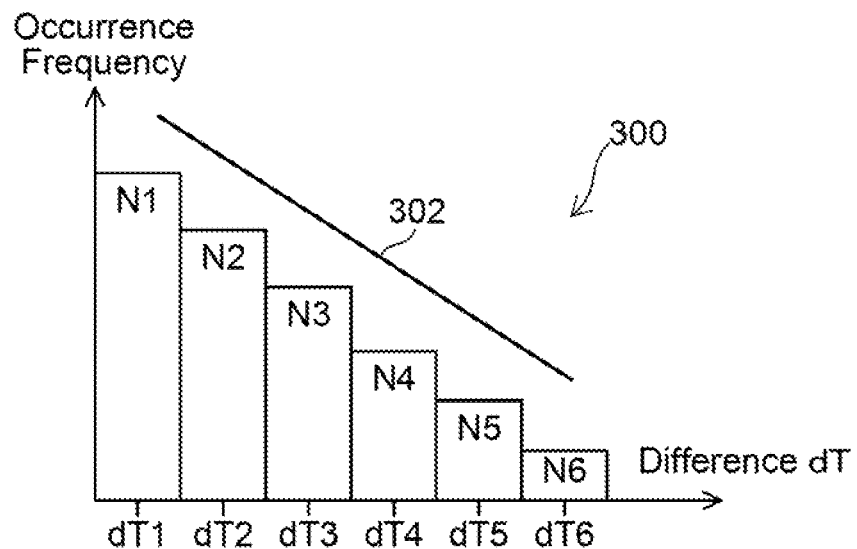
FIG. 14
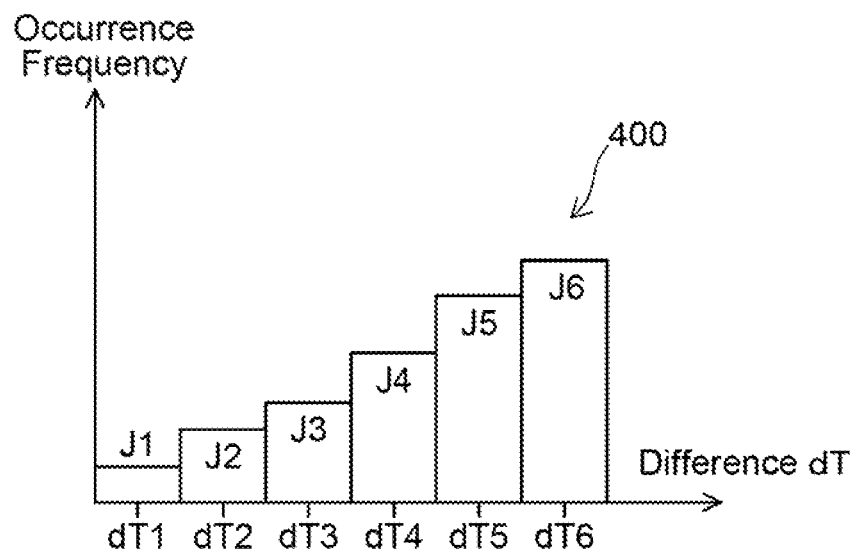
FIG. 15
$$[\text{Intermediate Data } J_i] = [\text{Number of Occurrences of Each Bin } N_i] \times \left(\frac{\text{Reference Temperature}}{\text{Representative Value of Bin}}\right)^{\text{SN Ratio}}$$

FIG. 20

| Subject Parts | Sign Prediction Items | Damage Level |
|---|---|---|
| Power Semiconductor Element | Element Deformation | ▨ |
| | Breakage of Element Electrode | ▨ |
| | Change in Element Characteristics (Diode Characteristics) | ▨ |
| Power Card | Breakage of Wire Bonds | ▨▨▨▨▨▨ ← G1 |
| | Wear of Bonding Material | ▨ |
| | Electromigration in Plating | ▨ |
| Heat Dissipating Material | Deterioration, Quality Change, and Defects in Heat Dissipating Material | ▨▨▨▨▨ ← G2 |
| Cooler | Decrease in Cooling Performance (Pump Failure) | ▨▨ |
| | Clog in Cooling System (Decrease in Flow Rate of Cooling Medium) | ▨▨ |

| Subject Parts | Sign Prediction Items | Damage Level | |
|---|---|---|---|
| Power Semiconductor Element | Element Deformation | ▰▰▰▰▰ | ⇒ Flag (A) |
| | Breakage of Element Electrode | ▰ | |
| | Change in Element Characteristics (Diode Characteristics) | ▰▰▰▰▰ | ⇒ Flag (B) |
| Power Card | Breakage of Wire Bonds | ▰▰ | |
| | Wear of Bonding Material | ▰▰▰▰▰ | ⇒ Flag (C) |
| | Electromigration in Plating | ▰ | |
| Heat Dissipating Material | Deterioration, Quality Change, and Defects in Heat Dissipating Material | ▰▰▰▰▰ | ⇒ Flag (D) |
| Cooler | Decrease in Cooling Performance (Pump Failure) | ▰▰ | |
| | Clog in Cooling System (Decrease in Flow Rate of Cooling Medium) | ▰▰ | |

Flag (A) × Weight Factor a = Score Aa

Flag (B) × Weight Factor b = Score Bb

Flag (C) × Weight Factor c = Score Cc

Flag (D) × Weight Factor d = Score Dd

Total Damage Level = Score Aa + Bb + Cc + Dd

FIG. 25

| Subject Parts | Sign Prediction Items | Damage Level | |
|---|---|---|---|
| Power Semiconductor Element | Element Deformation | ▨▨▨▨▨▨▨▨ | ⇒ Flag (A) |
| | Breakage of Element Electrode | ▨ | ⇒ Flag (B) |
| | Change in Element Characteristics (Diode Characteristics) | ▨▨▨▨▨▨ | ⇒ Flag (C) |
| Power Card | Breakage of Wire Bonds | ▨▨▨ | ⇒ Flag (D) |
| | Wear of Bonding Material | ▨▨▨▨▨▨ | ⇒ Flag (E) |
| | Electromigration in Plating | ▨ | ⇒ Flag (F) |
| Heat Dissipating Material | Deterioration, Quality Change, and Defects in Heat Dissipating Material | ▨▨▨▨▨▨ | ⇒ Flag (G) |
| Cooler | Decrease in Cooling Performance (Pump Failure) | ▨▨ | ⇒ Flag (H) |
| | Clog in Cooling System (Decrease in Flow Rate of Cooling Medium) | ▨▨▨ | ⇒ Flag (I) |

Flag (A) × Weight Factor a = Score Aa

Flag (B) × Weight Factor b = Score Bb

⋮   ⋮   ⋮

Flag (I) × Weight Factor i = Score Ii

Total Damage Level = Score Aa + Bb + Cc ··· Ii

FIG. 27

| Subject Parts | Sign Prediction Items | Damage Level | |
|---|---|---|---|
| Power Semiconductor Element | Element Deformation | ▰▰▰▰▰▰▰ | ⇨ Flag (A) |
| | Breakage of Element Electrode | ▰ | |
| | Change in Element Characteristics (Diode Characteristics) | ▰▰ | |
| Power Card | Breakage of Wire Bonds | ▰▰ | |
| | Wear of Bonding Material | ▰▰▰ | |
| | Electromigration in Plating | ▰ | |
| Heat Dissipating Material | Deterioration, Quality Change, and Defects in Heat Dissipating Material | ▰▰▰▰▰▰▰ | ⇨ Flag (B) |
| Cooler | Decrease in Cooling Performance (Pump Failure) | ▰▰▰ | |
| | Clog in Cooling System (Decrease in Flow Rate of Cooling Medium) | ▰▰▰ | |

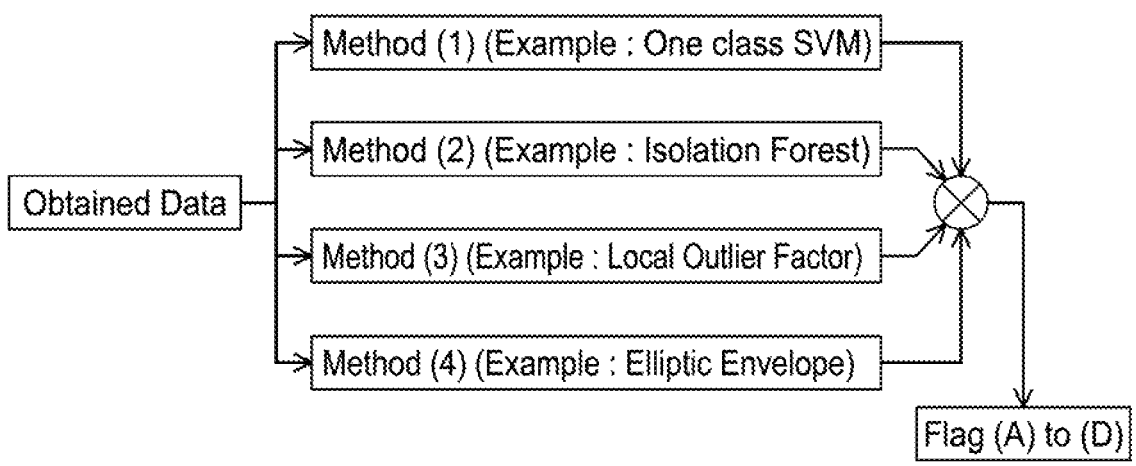

FAILURE PREDICTION SYSTEM

CROSS-REFERENCE TO RELATED APPLICATION

This application claims priority to Japanese Patent Application No. 2019-034672 filed on Feb. 27, 2019, the contents of which are hereby incorporated by reference into the present application.

TECHNICAL FIELD

The teaching disclosed herein relates to a failure prediction system configured to predict a failure of a power converter which converts output power of a power source to power for driving a traction motor.

BACKGROUND

Art for detecting a sign of failure is proposed. For example, Japanese Patent Application Publication No. 2015-146658 describes a power converter that can accurately detect a sign of failure of a semiconductor switching element. The power converter of Japanese Patent Application Publication No. 2015-146658 is installed in a railroad vehicle and is an inverter that converts DC power to AC power. Further, Japanese Patent Application Publication No. 2017-188030 describes a machine learning device that applies machine learning to failure prediction for a main shaft or a motor that drives the main shaft of a machine tool.

SUMMARY

The disclosure herein relates to a failure prediction system for a power converter configured to convert output electric power of an electric power source to electric power for driving a traction motor, and provides a failure prediction system that can predict a failure with higher accuracy than conventional art.

A failure prediction system disclosed herein is configured to predict a failure of a power converter which converts output power of a power source to power for driving a traction motor. The system may comprise: a sensor provided at the power converter; and a controller configured to predict a failure of the power converter based on a measurement value of the sensor. The controller may be configured to: calculate a difference between a previous measurement value and a present measurement value of the sensor, wherein the controller repeatedly calculates the difference at predetermined time intervals; obtain intermediate data by applying variable conversion to a plurality of the past differences; calculate a damage level of the power converter based on the intermediate data; and output a warning signal in a case where the damage level exceeds a damage threshold, wherein the warning signal indicates that a timing when the failure occurs is approaching.

The variable conversion may include one of statistical processing and machine leaning method.

The variable conversion may include: creating a histogram of the plurality of past differences; for each of bins in the histogram, multiplying a number of occurrences of the bin by a weight factor assigned to the bin; and obtaining the damage level by adding all products of the weight factors and the numbers of occurrences of the bins.

Each of the weight factors may be based on a value obtained by dividing a reference value assigned to corresponding one of the bins by a representative value of the bin.

The representative value of the bin means a median value of a width of the bin (a median value of a range between a maximum value and a minimum value of the bin).

The sensor may be one of: a temperature sensor configured to measure a temperature of a switching element for power conversion provided in the power converter; a temperature sensor configured to measure a temperature of a cooling medium for a cooler which cools the switching element; a current sensor configured to measure current passing through the switching element; and a voltage sensor configured to measure a voltage of the switching element.

The failure prediction system may further include a display configured to display that the timing when the failure occurs is approaching, in response to the warning signal.

The failure prediction system may include a plurality of power converters. The damage threshold may be determined by machine leaning from measurement values collected from the plurality of power converters.

The controller of the failure prediction system may include a local computer installed in a vehicle and a server located outside of the vehicle.

Details and further improvements to the techniques disclosed herein will be described in the following DETAILED DESCRIPTION.

BRIEF DESCRIPTION OF DRAWINGS

FIG. 10 is a cross-sectional view of another semiconductor device.

FIG. 11 is a list of items to which failure prediction can be performed.

FIG. 13 is a diagram explaining an example of variable conversion (a histogram before the variable conversion is applied).

FIG. 14 is a diagram explaining an example of variable conversion (a histogram after the variable conversion is applied).

FIG. 15 is an example of a variable conversion equation.

FIG. 20 is an example of how damage levels are displayed on a screen.

FIG. 23 is a diagram explaining a process for a case where damage levels of plural items have exceeded a damage threshold.

FIG. 24 is a diagram explaining a process of calculating a total damage level for the case where damage levels of plural items have exceeded the damage threshold.

FIG. 25 is a diagram explaining a process for a case of using the damage levels of all the items.

FIG. 26 is a diagram explaining a process of calculating the total damage level from the damage levels of all the items.

FIG. 27 is a diagram (1) explaining a case of using machine learning in sign detection.

FIG. 28 is a diagram (2) explaining the case of using the machine learning in the sign detection.

DETAILED DESCRIPTION (First Embodiment) A failure prediction system 10 of a first embodiment will be described with reference to the drawings. The failure prediction system 10 is installed in an electric vehicle 2. FIG. 1 shows a block diagram of the electric vehicle 2 including the failure prediction system 10.

Figure 1:
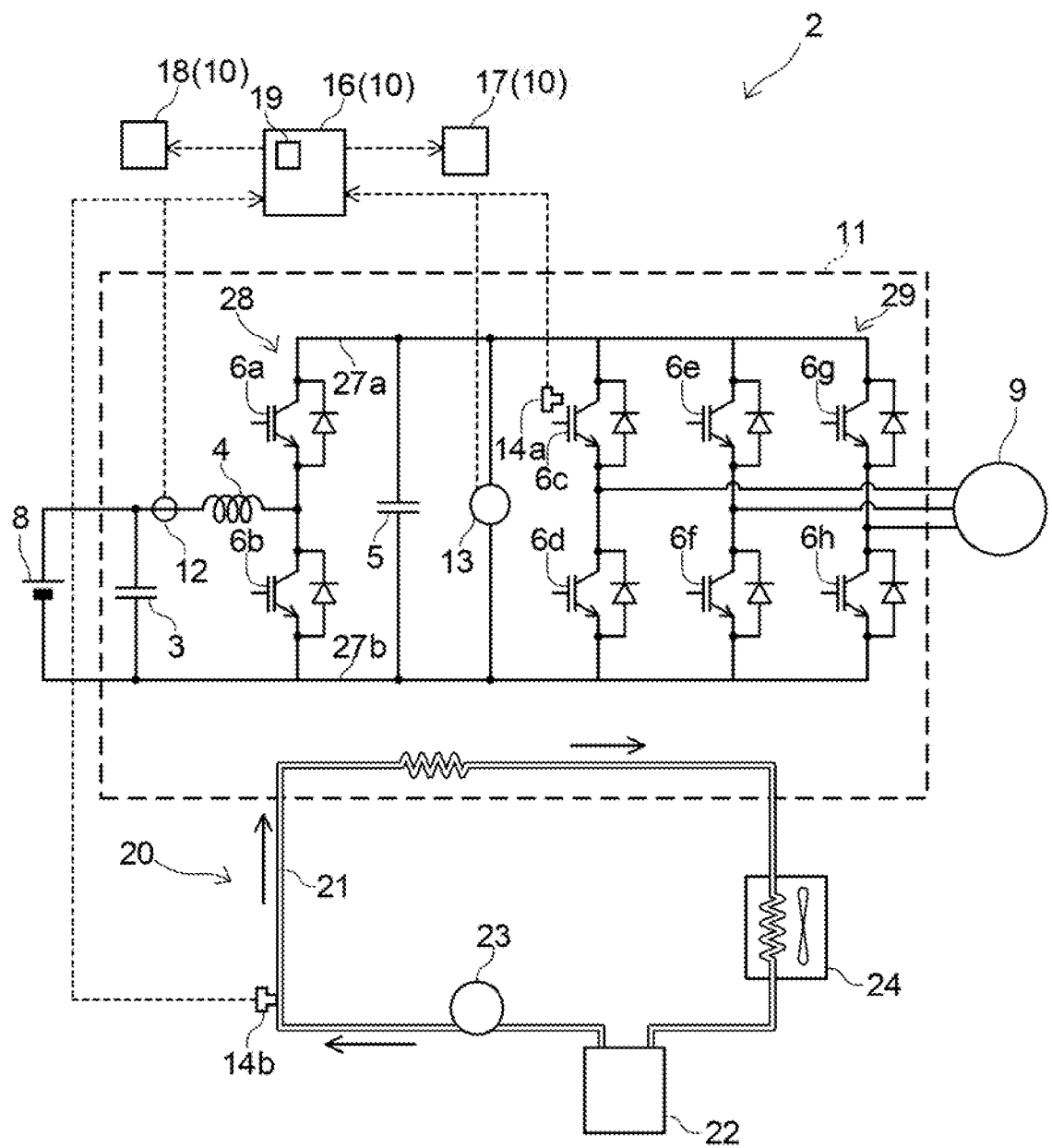
FIG. 1 is a block diagram of an electric vehicle including a failure prediction system of a first embodiment.

The electric vehicle 2 is provided with a power converter 11, a battery 8, a traction motor 9, a cooler 20, and a controller 16. A primary constituent member of the failure prediction system 10 is software installed in the controller 16.

The power converter 11 is a device configured to convert DC power of the battery 8 to power for driving the traction motor 9. The power converter 11 is provided with a voltage converter circuit 28, an inverter circuit 29, and two capacitors 3, 5.

The voltage converter circuit 28 includes a step-up function of stepping up a voltage of the battery 8 and outputting the same to the inverter circuit 29 and a step-down function of stepping down regenerative power obtained by power generation in the motor 9 and supplying the same to the battery 8. That is, the voltage converter circuit 28 is a bidirectional DC-DC converter.

The voltage converter circuit 28 is provided with two switching elements 6a, 6b, two diodes, and a reactor 4. The two switching elements 6a, 6b are connected in series between a positive line 27a and a negative line 27b that connect the voltage converter circuit 28 and the inverter circuit 29. Each diode is connected in antiparallel with corresponding one of the switching elements 6a, 6b. One end of the reactor 4 is connected to a midpoint of the series connection of the two switching elements 6a, 6b, and the other end thereof is connected to a positive electrode of the battery side of the circuit 28. The capacitor 3 is connected between positive and negative electrodes of the battery side of the circuit 28. A current sensor 12 is connected in series to the reactor 4. The current sensor 12 is configured to measure current that flows in the reactor 4, that is, current that flows in the voltage converter circuit 28. The switching elements 6a, 6b are controlled by the controller 16. The switching element 6a is involved primarily in a step-down operation, and the switching element 6b in involved primarily in a step-up operation. A configuration and operation of the voltage converter circuit 28 are well known, thus a detailed description thereof will be omitted.

The inverter circuit 29 is provided with six switching elements 6c to 6h and six diodes. The six switching elements 6c to 6h are connected in series in pairs of two. The three series connection circuits are connected in parallel between the positive line 27a and the negative line 27b. Each diode is connected in antiparallel with corresponding one of the six switching elements 6c to 6h. The six switching elements 6c to 6h are also controlled by the controller 16. AC current is outputted from a midpoint of each of the three series connection circuits. An AC output terminal of the inverter circuit 29 is connected to the motor 9. Since a configuration and operation of the inverter circuit 29 are well known as well, a detailed description thereof will be omitted.

The switching elements 6a to 6h are mounted in some power modules.

A capacitor 5 and a voltage sensor 13 are connected between the positive line 27a and the negative line 27b. The capacitor 5 is configured to suppress pulsation of current flowing between the voltage converter circuit 28 and the inverter circuit 29. The voltage sensor 13 is configured to measure an output voltage of the voltage converter circuit 28, that is, an input voltage of the inverter circuit 29.

The inverter circuit 29 is provided with a temperature sensor 14a configured to measure a temperature of the switching element 6c. Measurement values of the current sensor 12, the voltage sensor 13, and the temperature sensor 14a are sent to the controller 16.

Large current will flow in the power converter 11. Since large current flows in the switching elements 6a to 6h, their heat generation amount is large. The cooler 20 is configured to cool the switching elements 6a to 6h of the power converter 11. The cooler 20 is provided with a cooling medium passage 21, a pump 23, a radiator 24, a reservoir tank 22, and a temperature sensor 14b. A part of the cooling medium passage 21 passes through a housing of the power converter 11. The pump 23 pumps out a cooling medium from the reservoir tank 22, by which the cooling medium flows in the cooling medium passage 21.

Inside the power converter 11, the cooling medium passage 21 passes near the power modules in which the switching elements are mounted, and the cooling medium flowing in the cooling medium passage 21 cools the power modules. The cooling medium is water or an antifreeze liquid. The cooling medium that has absorbed heat from the switching elements 6a to 6h inside the power converter 11 dissipates the heat in the radiator 24 and returns to the reservoir tank 22.

The temperature sensor 14b is attached to the cooling medium passage 21 and is configured to measure a temperature of the cooling medium. A measurement value of the temperature sensor 14b is also sent to the controller 16. The pump 23 is also controlled by the controller 16. The controller 16 is configured to monitor the cooling medium temperature and the temperature of the switching element 6c, and to control the pump 23 such that the temperature of the switching element 6c (6a to 6h) is maintained in a suitable temperature range.

A nonvolatile memory 17 and an in-vehicle display 18 are connected to the controller 16. The controller 16 functions as the failure prediction system 10 (to be described later). When detecting a sign of failure, the controller 16 stores the detected state in the nonvolatile memory 17 and displays on the display 18 a message indicating that the sign of failure has been detected.

The controller 16 is a computer including a central processing unit (CPU), a memory, and various I/Os. Various programs are stored in the memory, and the controller 16 performs various functions by the CPU executing the respective programs. A program for controlling the switching elements 6a to 6h and a program for controlling the pump 23 are also stored in the memory. The failure prediction system 10 is also realized by the CPU executing another program stored in the memory. A part of the memory is a random access memory used for temporary storage of data. A part of the random access memory of the controller 16 is termed a counter memory 19. The counter memory 19 is used in a process of predicting a failure. The counter memory 19 will be described later.

Phrase "predict a failure" means to detect a sign of failure. A process of detecting a sign of failure will be described. As described above, the switching elements 6a to 6h generate a large amount of heat, and therefore they deteriorate under long-term use. The electric vehicle 2 is provided with the failure prediction system 10 that is configured to detect an increase in the possibility of an occurrence of failure as a result of progression of the deterioration of the switching elements 6a to 6h (that is, the power converter 11).

The failure prediction system 10 will be described. The failure prediction system 10 includes the controller 16, the nonvolatile memory 17, and the display 18. Although it will be described later, functions of the failure prediction system 10 may be partially realized by a server located outside of the vehicle.

The controller 16 measures the temperature of the switching element 6c by the temperature sensor 14a which the power converter 11 is provided with. Although the power converter 11 is provided with the plurality of switching elements 6a to 6h, the temperature of the switching element 6c is regarded as a representative value of the plurality of switching elements 6a to 6h. Hereinbelow, the switching elements 6a to 6h will collectively be termed switching elements 6, and the measurement value of the temperature sensor 14a represents the temperature of the switching elements 6. The controller 16 detects a sign of failure of the switching elements 6 (that is, the power converter 11) based on the measurement value of the temperature sensor 14a.

Figure 2:
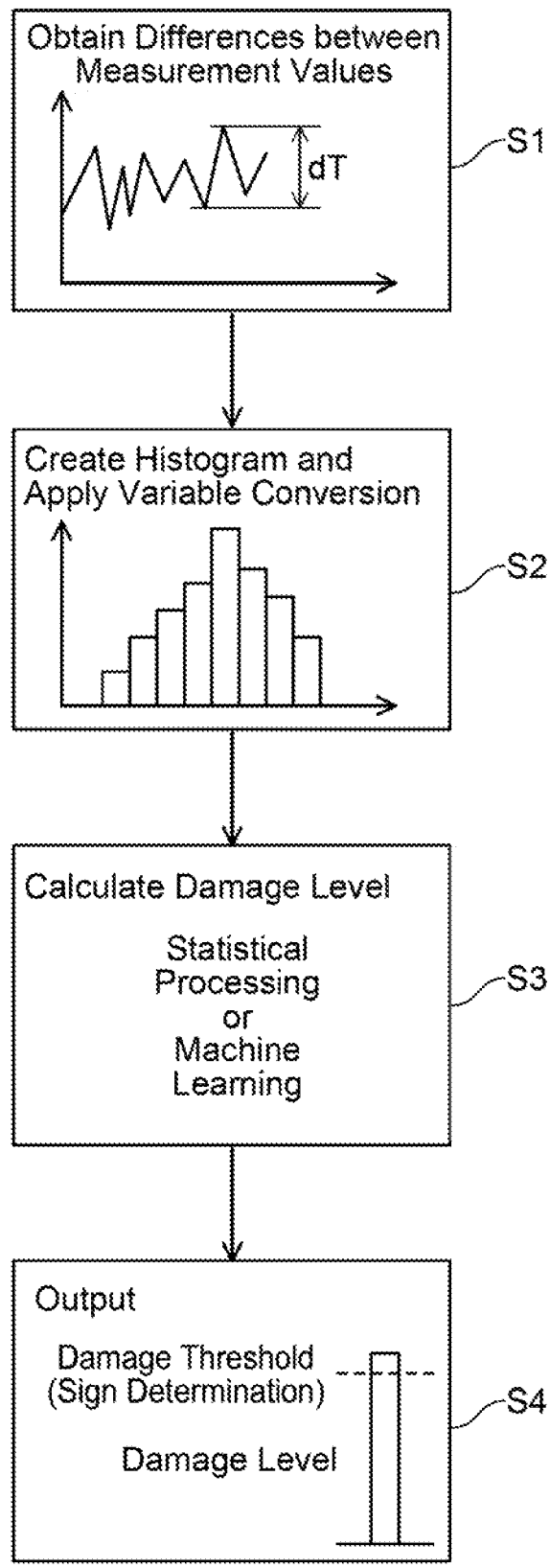
FIG. 2 is a diagram explaining an overview of failure prediction.

FIG. 2 shows an overview of the process of failure prediction (detection of a sign of failure). The controller 16 periodically repeats the process of FIG. 2. The controller 16 calculates a difference dT between a previous measurement value of the temperature sensor 14a and a present measurement value thereof (step S1). The controller 16 obtains a latest difference dT each time it executes the process of FIG. 2. The controller 16 stores the differences dT obtained in the past. Each difference dT is a temperature difference between the temperature of the switching elements 6 in the process of FIG. 2 presently executed and the temperature thereof in the process of FIG. 2 previously executed.

Next, the controller 16 creates a histogram using the plurality of past differences dT (step S2). The controller 16 obtains intermediate data by applying variable conversion to an occurrence frequency of each of bins classified in the histogram. SN ratio is used for the variable conversion. The SN ratio herein is a ratio of stress (S) to a Number (N) determined based on a representative value of each bin in the histogram.

Next, the controller 16 calculates a damage level from the obtained intermediate data, by statistical processing or machine learning (step S3). The controller 16 compares the obtained damage level with a damage threshold. When the damage level exceeds the damage threshold, the controller 16 determines that a failure would be highly likely to occur and outputs a warning signal (message) indicating that a timing when a failure occurs is approaching (step S4).

Figures 3, 4:
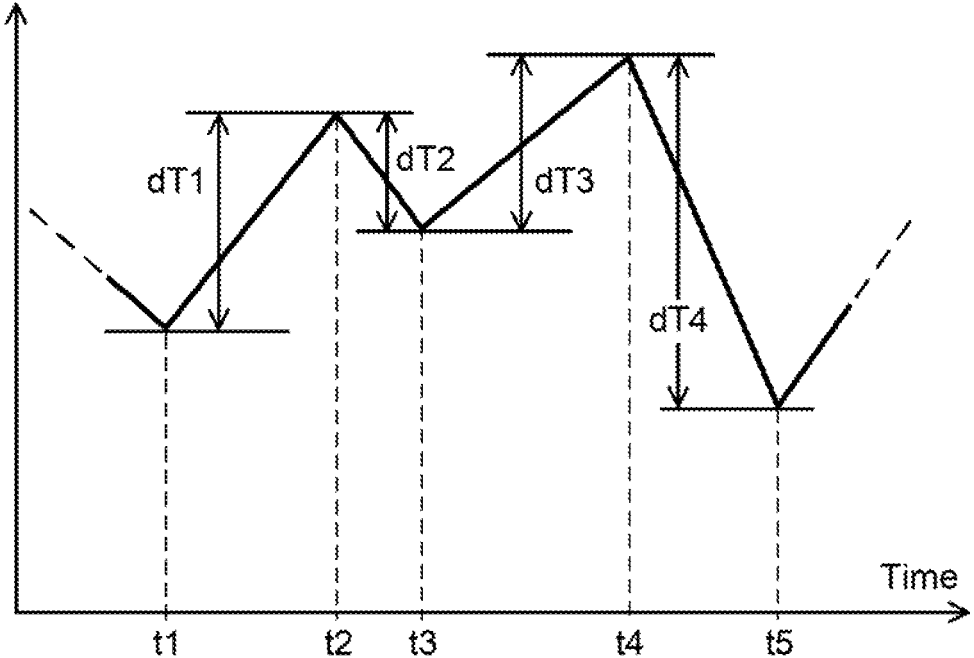
FIG. 3 is a graph showing an example of a temperature change in switching elements.
FIG. 4 is a table showing an example of a histogram.

FIG. 3 shows an example of change in the measurement values of the temperature sensor 14a (that is, change in the temperature of the switching elements 6). The graph of FIG. 3 corresponds to time series data of the temperature of the switching elements 6. The controller 16 obtains the difference dT by subtracting the measurement value obtained at time t(n−1) from the measurement value obtained at time t(n). The controller 16 stores the obtained differences dT.

The controller 16 creates the histogram using the plurality of past differences dT. For this, the controller 16 secures a region for storing the histogram. This region is the aforementioned counter memory 19. Each bin of the histogram has a predetermined temperature range. The counter memory 19 is in fact a region for storing the number of occurrences of each bin in the histogram and includes as many memory areas as the number of bins. Each memory area for corresponding one of the bins stores an integer variable (counter) for counting the number of occurrences. The controller 16 stores a reference value for each bin in advance. Assuming that the switching elements 6 repeatedly undergo a change of temperature difference that belongs to a particular bin, performance of the switching elements 6 is estimated to significantly deteriorate when the number of repetitive changes exceeds the reference value. In other words, assuming that the switching elements 6 repeatedly undergo a change of temperature difference of a bin corresponding to a reference value, the reference value is defined as a limit of the number of repetitive changes up to which the switching elements 6 can maintain their performance. In this regard, each reference value provides an index of thermal stress up to which the switching elements 6 can maintain their performance. The reference values can thus be termed deterioration index. The reference values (deterioration index) are prepared for the respective bins. The reference values (deterioration index) are specified by simulations or experiments in advance.

For each of the calculated differences dT, the controller 16 increments the number of occurrences of the bin by one, the bin corresponds to the temperature difference. That is, it uses the plurality of calculated differences dT to create the histogram that defines widths of the bins by magnitudes of the differences dT. FIG. 4 shows an example of the histogram. This histogram is constituted of four bins. For a bin 1, its range of the difference dT is set in a range of $A1 \leq dT < A2$, and the reference value (deterioration index) thereof is C1. For a bin 2, its range of the difference dT is set in a range of $A2 \leq dT < A3$, and the reference value thereof is C2. For a bin 3, its range of the difference dT is set in a range of $A3 \leq dT < A4$, and the reference value thereof is C3. For a bin 4, its range of the difference dT is set in a range of $A4 \leq dT < A5$, and the reference value thereof is C4. In the example of FIG. 4, the number of occurrences of the bin 1 is B1, the number of occurrences of the bin 2 is B2, the number of occurrences of the bin 3 is B3, and the number of occurrences of the bin 4 is B4. FIG. 4 is merely an example, and the number of bins and widths thereof may suitably be determined. FIG. 3 only shows a part of the time series data of the measurement values, and the time series data may include a large number of measurement values.

Figure 5:
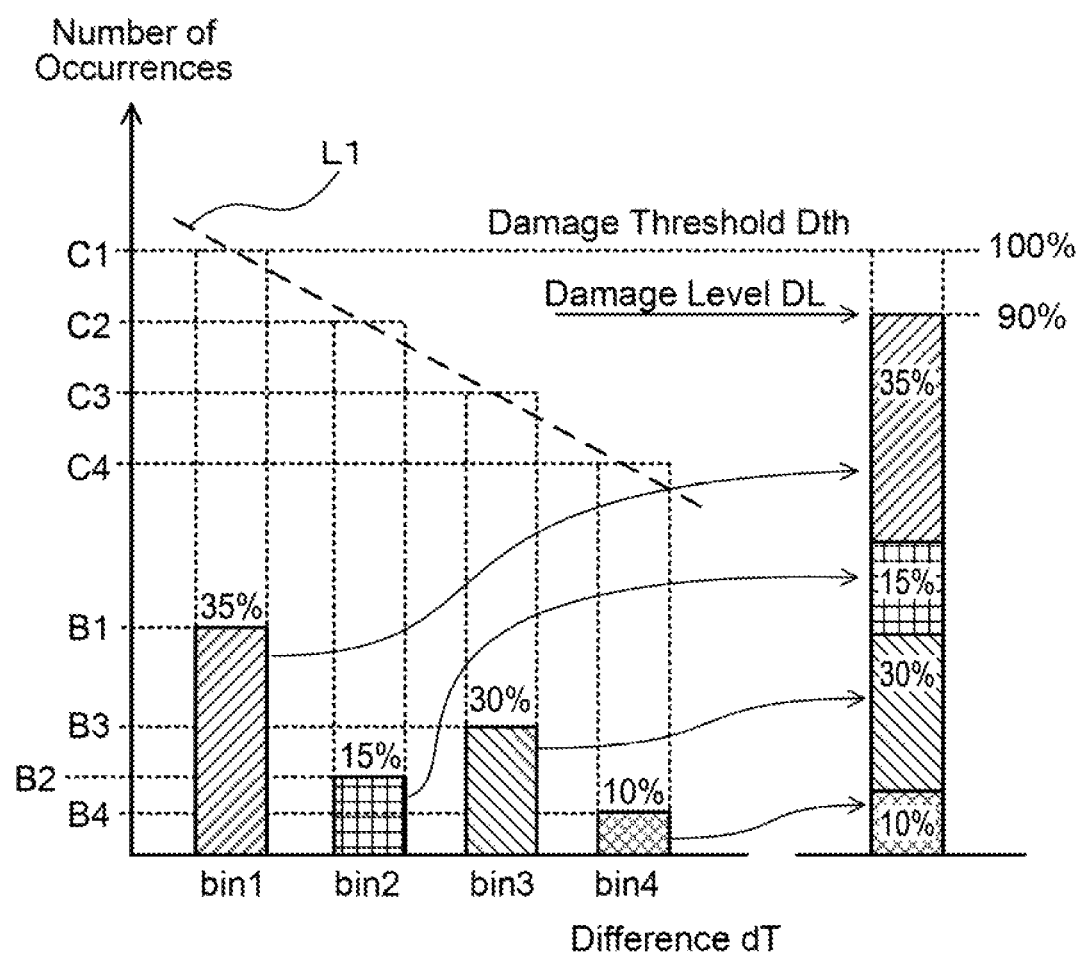
FIG. 5 is a graph corresponding to the table of FIG. 4.

FIG. 5 is a graph of the table of FIG. 4. A broken line L1 is a line that connects the reference values Cn (where "n" is a bin number) of the respective bins. A horizontal axis of the graph represents the bins, that is, the differences dT, and the difference dT becomes larger toward the right. As can be understood from the broken line L1 of FIG. 5, the reference value Cn becomes smaller as the difference dT becomes larger. This is because thermal expansion (or contraction) caused in the switching elements 6 and their surrounding components is larger as the difference dT (temperature difference) becomes larger.

The differences dT may be various values. As shown in FIG. 5, the plurality of differences dT extracted from the time series data is distributed into the plurality of bins. The thermal stress which the switching elements 6 undergo is difficult to evaluate in the histogram. Thus, the controller 16 gathers up information indicated by the histogram (information indicating a degree of the thermal stress) as one index. This index is termed a damage level DL. A procedure to calculate the damage level DL will be described next.

For each bin, the controller 16 calculates a ratio of the number of occurrences Bn relative to the reference value Cn. The ratio is termed an individual damage ratio Dn of the bin. Here, "n" in the "number of occurrences Bn", the "reference value Cn", the "bin n", and the "individual damage ratio Dn" indicates a bin number. The same applies hereinbelow. The individual damage ratios Dn correspond to an example of the aforementioned intermediate data.

The individual damage ratio Dn of the bin n is a value that indicates a percentage of a damage which the switching elements 6 have undergone relative to a tolerable damage, assuming that only the difference (temperature change) of the bin is caused in the switching elements 6. Each individual damage ratio Dn is calculated by the number of occurrences Bn/the reference value Cn. In the example of FIG. 5, the individual damage ratio Dn of each bin is as follows: the individual damage ratio D1 of the bin 1 is D1=B1/C1=35%, the individual damage ratio D2 of the bin 2 is D2=B2/C2=15%, the individual damage ratio D3 of the bin 3 is D3=B3/C3=30%, and the individual damage ratio D4 of the bin 4 is D4=B4/C4=10%.

Next, the controller 16 adds up the individual damage ratios Dn of all the bins. A graph that schematically shows the addition of the individual damage ratios Dn of all the bins is shown on the right side of FIG. 5. This addition result corresponds to the aforementioned damage level DL. The individual damage ratio Dn of each bin is a ratio of a thermal damage caused by the difference dT of the bin relative to a tolerable thermal damage. Thus, the addition result (damage level DL) obtained by adding the individual damage ratios Dn of all the bins is an overall thermal damage which the switching elements 6 have undergone. Further, the damage level DL indicates a ratio of the thermal damage which the switching elements 6 have undergone so far relative to the thermal damage which the switching elements 6 can tolerate. The damage level DL is an estimation value of a relative level of the thermal damage which the switching elements 6 have undergone relative to the thermal damage which the switching elements 6 can tolerate.

When the damage level DL exceeds a damage threshold Dth, a failure is highly likely to occur. That is, the damage level DL exceeding the damage threshold Dth corresponds to a sign of failure. The damage level DL which the controller 16 calculates exceeding the damage threshold Dth corresponds to detection of a sign of failure. When the damage level DL exceeds the damage threshold Dth, the controller 16 outputs a signal (message) indicating that a failure is highly likely to occur.

The process of detecting a sign of failure will be described again with reference to the flowchart of FIG. 6. The controller 16 obtains a measurement value of the temperature sensor 14a (that is, the temperature of the switching elements 6) every predetermined time period (step S12). Then, the controller 16 calculates each difference dT by subtracting the previous measurement value from the present measurement value (step S13).

Next, for each of the calculated differences, the controller 16 increments, by one, the number of occurrences of the bin that corresponds to the difference and is stored in the counter memory 19 (step S14). Since the value in the counter memory 19 corresponding to each bin (that is, the present number of occurrences) is incremented by one at a time, it may be termed a "counter". As such, step S14 of FIG. 6 uses the expression "counter". After incrementing all the counters (the numbers of occurrences) stored in the counter memory 19 for all the calculated differences, the controller 16 proceeds to the subsequent step S15.

Next, the controller 16 calculates the individual damage ratio Dn of each bin. Specifically, the controller 16 calculates Dn=Bn/Cn for each bin (step S15). Here, "Bn" is the number of occurrences of the bin n and is the counter value stored in the counter memory 19. "Cn" is the reference value preset for the bin n. Further, the controller 16 adds up the individual damage ratios Dn of the respective bins to obtain the damage level DL (S16). The meanings of the individual damage ratios Dn and the damage level DL are as aforementioned.

Next, the controller 16 compares the damage level DL to the damage threshold Dth (step S17). In a case where the damage level DL does not exceed the damage threshold Dth (step S17: NO), the controller 16 terminates the process. In a case where the damage level DL exceeds the damage threshold Dth, the controller 16 outputs the warning signal indicating that the timing when a failure occurs is approaching (step S17: YES, S18). As described above, the damage level DL calculated by the controller 16 exceeding the damage threshold Dth corresponds to detection of a sign of failure.

The warning signal is sent to the nonvolatile memory 17 and the display 18. The nonvolatile memory 17 stores the damage level DL and time and date when the damage level DL exceeded the damage threshold Dth. The display 18 having received the warning signal turns on a warning lamp indicating that the timing when a failure occurs is approaching. The display 18 having received the warning signal may display a message prompting to take the vehicle to a car dealer.

Figure 6:
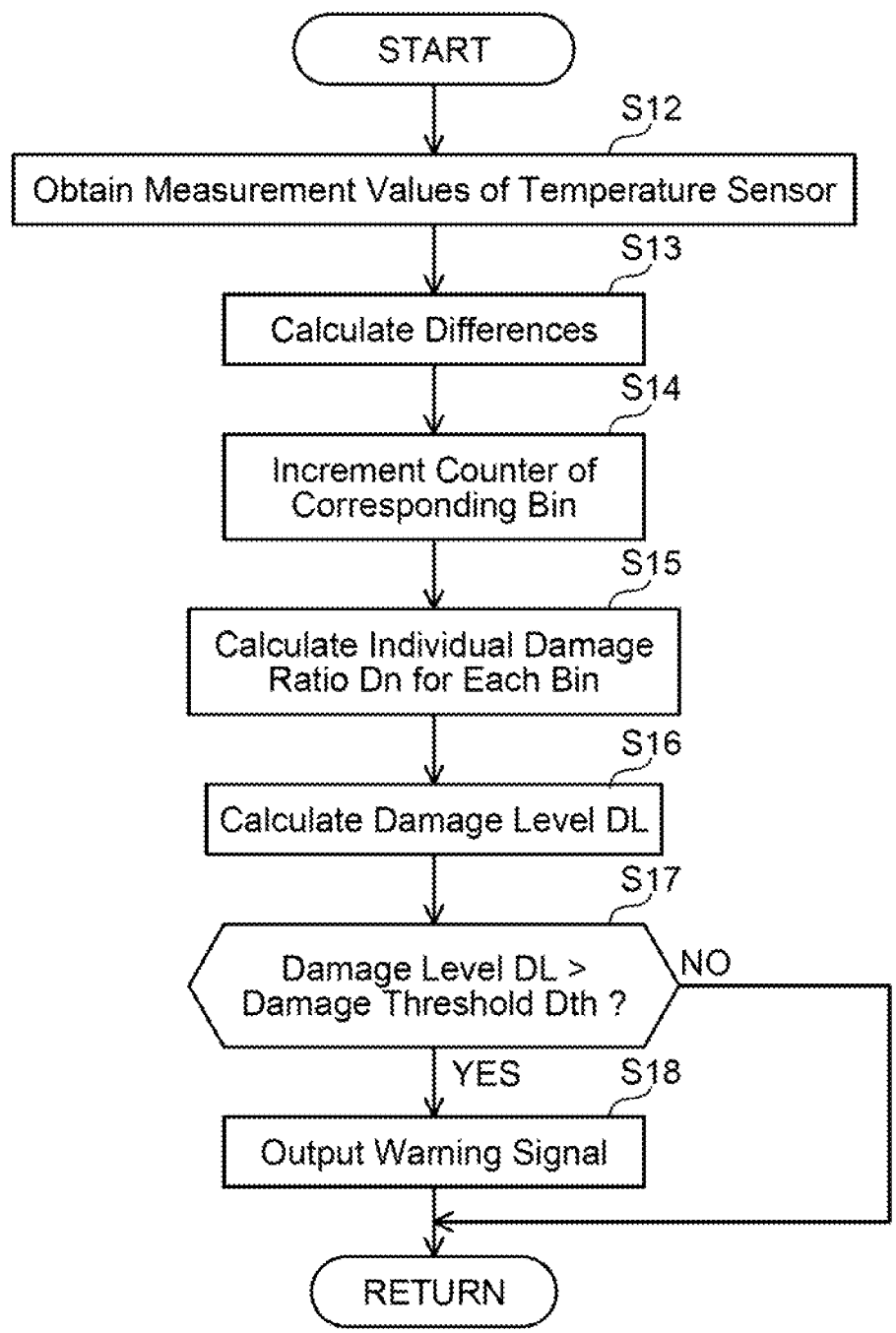
FIG. 6 is a flowchart of a process of detecting a sign of failure.

The process of FIG. 6 is started when the electric vehicle 2 is put to use by a user and is repeatedly executed. Each time the process of FIG. 6 is executed, the counter memory 19 is updated and a new damage level DL is calculated. That is, the histogram of the temperature differences of the switching elements 6 is periodically updated.

Variants and some features of the failure prediction system will be described.

Figure 7:
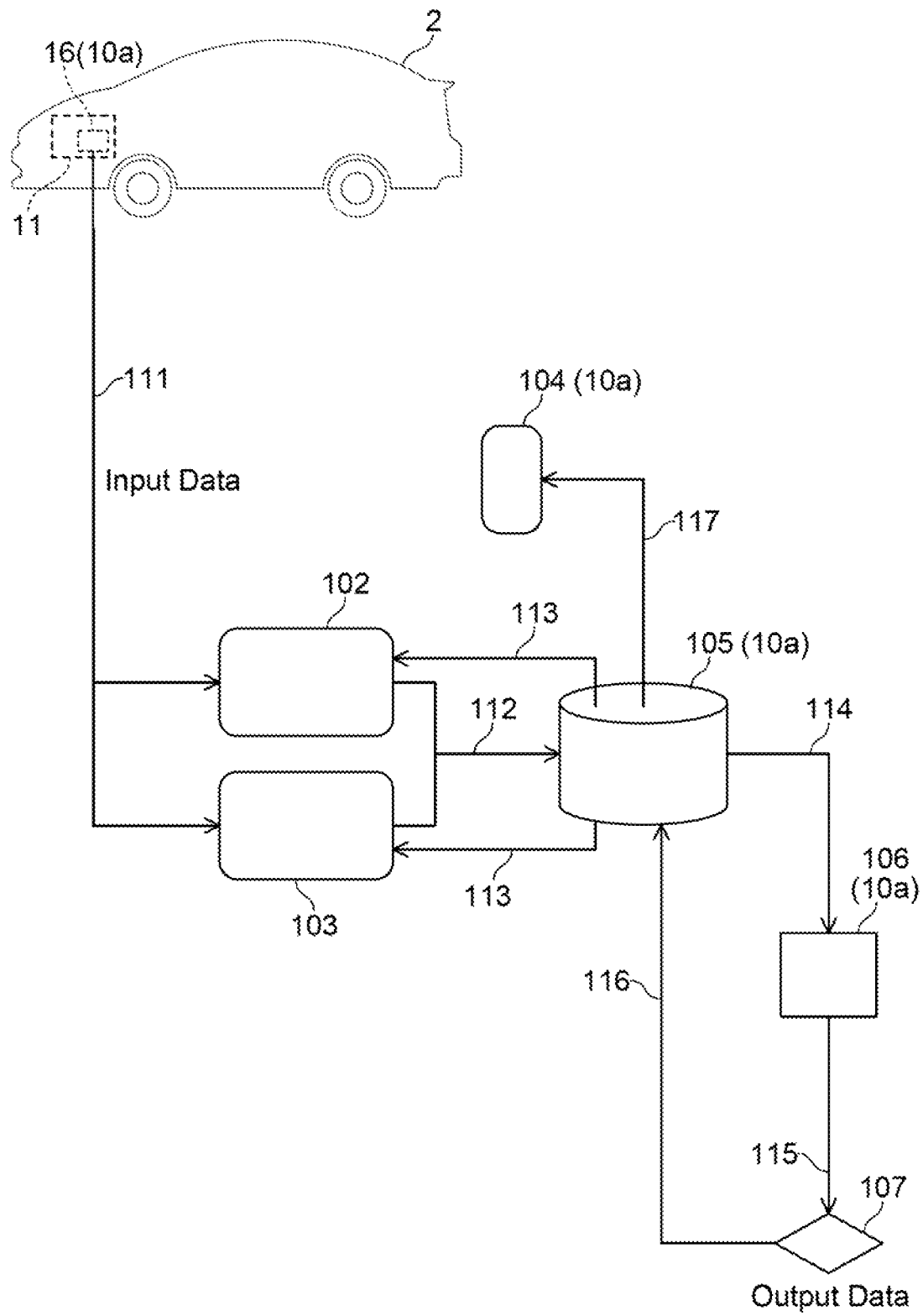
FIG. 7 is a block diagram for an application example of a failure prediction system of a variant.

FIG. 7 shows a block diagram of an application example using a failure prediction system 10a of a variant. A part of the failure prediction system 10a of the variant is installed in the electric vehicle 2. Specifically, a part of the failure prediction system 10a is implemented in the controller 16 of the power converter 11 of the electric vehicle 2. Remaining parts of the failure prediction system 10a are constituted of a mobile terminal 104, a data server 105, and an analysis terminal 106 that are located outside of the electric vehicle 2.

The controller 16 of the power converter 11 sends the measurement values of the temperature sensor 14a of the power converter 11 to a dealer 102 and a parts supplier 103 (an arrow line 111). The measurement values correspond to input data for the dealer 102 and the parts supplier 103.

The dealer 102 and the parts supplier 103 send the input data (the measurement values of the temperature sensor) to the data server 105 (an arrow line 112). The input data is sent from the data server 105 to the analysis terminal 106 (an arrow line 114). In the analysis terminal 106, a histogram and intermediate data are created and a damage level is calculated. Output data 107 (that is, the damage level) is stored in the data server 105 (arrow lines 115, 116).

In a case where the damage level exceeds a damage threshold, a warning signal is notified from the data server 105 to the dealer 102, the parts supplier 103, and the mobile terminal 104 (arrow lines 113, 117). The mobile terminal 104 is a possession of an owner of the electric vehicle 2. Through the mobile terminal 104, the owner of the electric vehicle 2 can be aware that the timing when a failure occurs in the power converter 11 is approaching.

According to the application example of FIG. 7, the owner of the electric vehicle 2 may enjoy the following advantages. Failures such as breakdown of the electric vehicle 2 on the road, accidental failures, and failures caused by wear can be prevented. Further, an actual condition of the electric vehicle 2 can be visualized, by which it is easy to lay a maintenance plan.

In a case where the electric vehicle 2 is possessed by a transportation service providing company, the transportation service providing company may enjoy the following advantage. The transportation service providing company can be aware of the actual condition of the electric vehicle which it owns, by which a maintenance plan thereof can be optimized.

Further, the dealer 102 and the parts supplier 103 of the electric vehicle 2 enjoy the following advantages. An actual market situation can be visualized. Visualization of the actual market situation is useful for enhancing parts design and addition of new values. Further, research and development (R&D) lead time can be shortened. Shortening the R&D lead time contributes to cost reduction. Moreover, an appropriate asset value of the vehicle (preowned vehicle) can be calculated. Further, units of the preowned vehicle can be re-used in share ride businesses and infrastructures.

Figure 8:
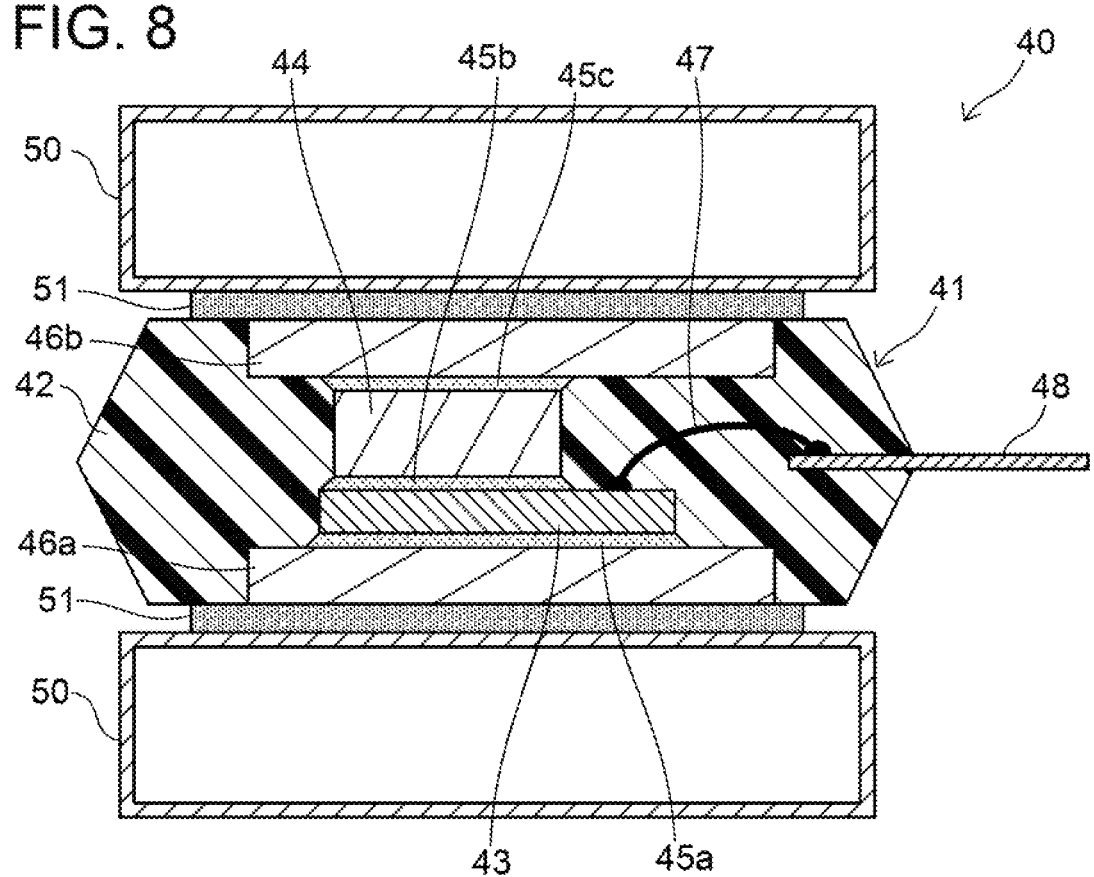
FIG. 8 is a cross-sectional view of a semiconductor device of an example used in a power converter.

FIG. 8 shows a cross-sectional view of an exemplary semiconductor device 40 used in the power converter 11. The semiconductor device 40 is a device in which the switching elements 6 and a part of the cooling passage 21 of the cooler 20 shown in FIG. 1 are integrated.

The semiconductor device 40 is provided with a power card 41 and two coolers 50. The two coolers 50 interpose the power card 41 therebetween. Insides of the coolers 50 are passages through which the cooling medium flows. The two coolers 50 correspond to a part of the cooling medium passage 21 of FIG. 1. Grease 51 is interposed between the coolers 50 and the power card 41.

Figure 9:
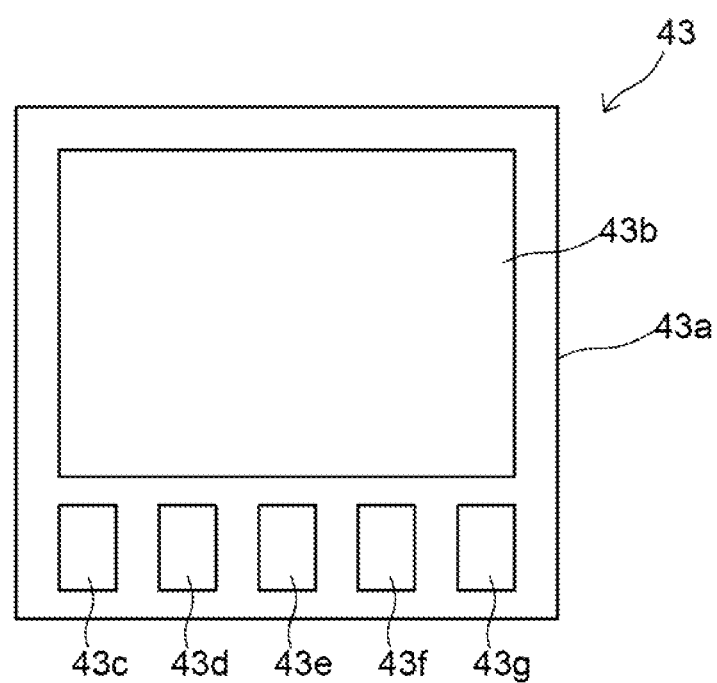
FIG. 9 is a plan view of a power semiconductor.

The power card 41 is a device in which a power semiconductor 43 is encapsulated in a resin package 42. A plan view of the power semiconductor 43 is shown in FIG. 9. The switching elements 6 and the diodes of FIG. 1 are assembled inside a body 43a of the power semiconductor 43. Each of the diodes is connected in antiparallel with its corresponding switching element 6 inside the body 43a. The body 43a is flat, and has a positive electrode 43b and a plurality of control pads 43c to 43g exposed at one surface thereof. A negative electrode is exposed at another surface thereof. The positive electrode 43b corresponds to positive-side electrodes of the switching elements 6 (collectors or drains in a case of n-type transistors). The negative electrode corresponds to negative-side electrodes of the switching elements 6 (emitters or sources in the case of the n-type transistors). The control pads 43c to 43g are electrically connected to gate electrodes and/or sense emitters of the switching elements 6.

The explanation continues returning to FIG. 8. The negative electrode of the power semiconductor 43 is bonded to a heat dissipating plate 46a via a solder layer 45a. The positive electrode of the power semiconductor 43 is bonded to a copper block 44 via a solder layer 45b. The opposite side of the copper block 44 is bonded to a heat dissipating plate 46b via a solder layer 45c. Each of the heat dissipating plates 46a, 46b is embedded in the package 42 with its one surface exposed therefrom. The control pads 43c to 43g (see FIG. 9) of the power semiconductor 43 are connected to control terminals 48 by bonding wires 47. The control terminals 48 extend to outside of the package 42 from inside thereof.

FIG. 10 shows a cross-sectional view of another semiconductor device 60. The semiconductor device 60 is a device in which a power semiconductor 43, an insulation substrate 64, and a lead frame 66 are accommodated within a case 62. The power semiconductor 43 is the same as the power semiconductor which the semiconductor device 40 of FIG. 8 includes.

A negative electrode that is exposed at one of wide surfaces of the power semiconductor 43 is bonded to the insulation substrate 64 via a solder layer 65b. The insulation substrate 64 is a composite plate in which copper layers are provided on both surfaces of an insulation plate. The opposite surface of the insulation substrate 64 is bonded to a bottom surface of the case 62 via a solder layer 65a. A positive electrode that is exposed at the other of the wide surfaces of the power semiconductor 43 is bonded to the lead frame 66 via a solder layer 65c. The control pads 43c to 43g of the power semiconductor 43 (see FIG. 9) are connected to control terminals 68 by bonding wires 67. The control terminals 68 extend to outside of the case 62 from inside thereof. The inside of the case 62 is filled with resin 61, and the power semiconductor 43, the insulation substrate 64, and the lead frame 66 are embedded in the resin 61. A cooler 69 is attached to a lower surface of the case 62.

In this embodiment, the thermal damage level of the switching elements 6 is calculated based on the temperature of the switching elements 6. The art disclosed herein may be applied to prediction of various failures. FIG. 11 shows a list of items subject to the failure prediction. Parts which can be subjects to the failure prediction may include a power semiconductor, a power card, a heat dissipating material, a cooler, and the like which are assembled in a power converter. Sign detection items of the power semiconductor may include element deformation, breakage of element electrode, and change in element characteristics (diode characteristics). Sign detection items of the power card may include breakage of wire bonds, wear of bonding material, and electromigration in plating. Sign detection items of the heat dissipating material may include deterioration, quality change, and defects in the heat dissipating material. Sign detection items of the cooler may include decrease in cooling performance (pump failure) and clog in cooling system (decrease in flow rate of cooling medium). These are mere examples, and sign detection items other than those listed in FIG. 11 may be used.

Figure 12:
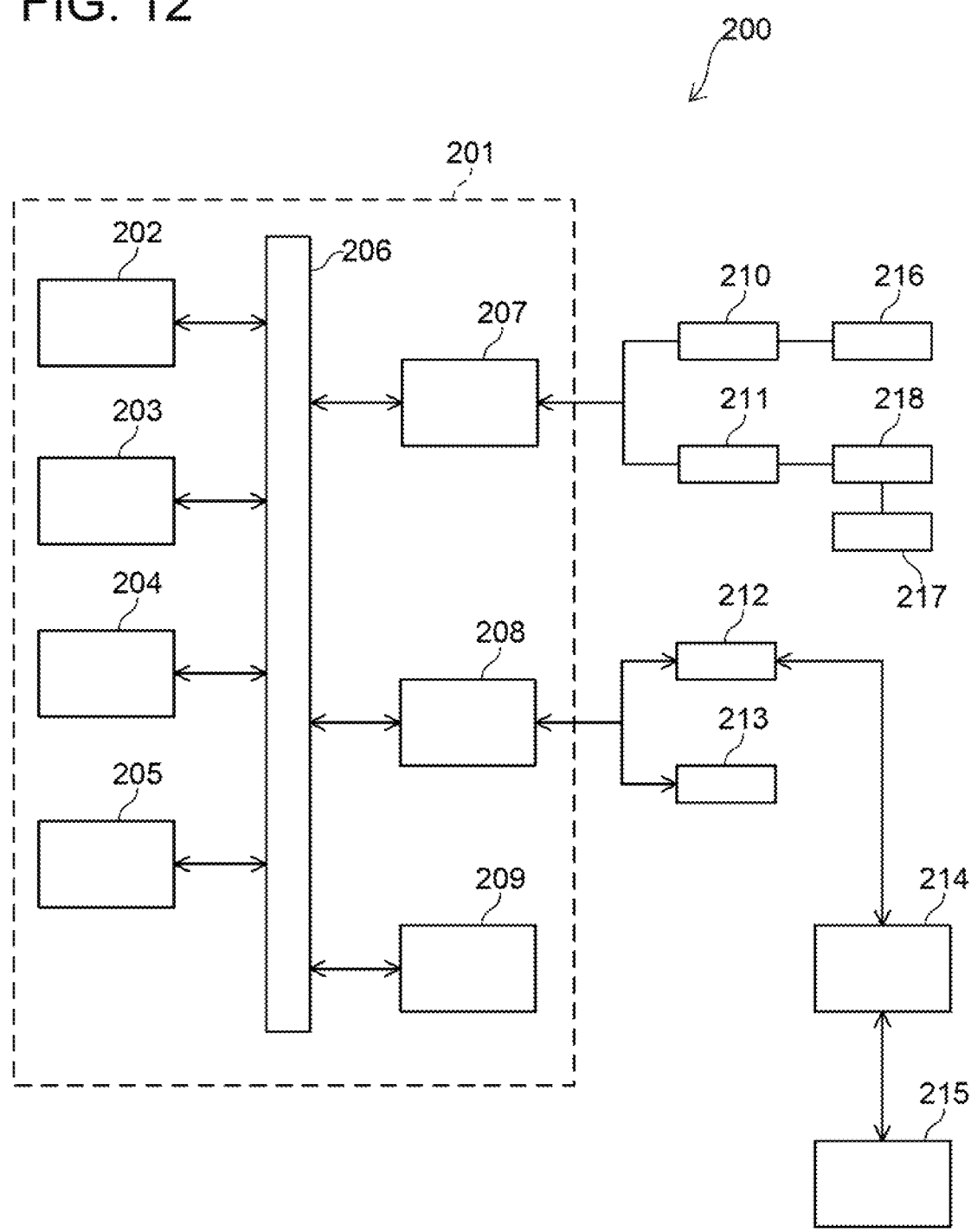
FIG. 12 is a block diagram of a failure prediction system of a second embodiment.

(Second Embodiment) FIG. 12 shows a block diagram of a failure prediction system 200 of a second embodiment. The failure prediction system 200 is provided with a controller 201 and sensors 216, 217. The controller 201 is provided with a central processing unit (CPU) 202, a read-only memory 203, a random access memory 204, a non-volatile memory 205, an AD converter 207, a communication interface 208, and a wireless communication module 209. These are communicably connected to each other by a bus 206.

The sensor 216 is attached to a power converter. The sensor 216 may, for example, be the current sensor 12, the voltage sensor 13, or the temperature sensor 14a of FIG. 1.

A measurement value 210 of the sensor 216 is inputted to the central processing unit 202 through the AD converter 207.

In a case where a physical quantity to be measured by the sensor 216 cannot be measured, an estimation value 211 of the physical quantity to be measured by the sensor 216 may be obtained from a measurement value 218 of the other sensor 217. The estimation value 211 is obtained in the AD converter 207. The estimation value 211 is also inputted to the central processing unit 202 through the AD converter 207.

The communication interface 208 is communicably connected with an external connection device 212 and a display device 213. The external connection device 212 is configured to communicate with an external server 214. The external server 214 is connected to a maintenance system 215. The failure prediction system 200 of FIG. 12 is configured to execute the process shown in FIG. 6 (the process of detecting a sign of failure), for example.

(Other Features) As described with reference to FIG. 2, the failure prediction system disclosed herein creates the histogram from the plurality of past differences and applies the variable conversion to the occurrence frequency of each bin in the histogram (step S2 of FIG. 2). An example of such application of the variable conversion will be described with reference to FIGS. 13 to 15.

FIG. 13 shows a histogram 300 with a plurality of past differences. The histogram 300 is divided into six bins, and representative values of the bins are differences dT1 to dT6. The representative value of each bin is a median value of the minimum and maximum values of the difference indicated by the bin.

A line 302 depicted in FIG. 13 shows the SN ratio. As described, the SN ratio in the disclosure herein is the ratio of stress (S) to value (N) determined based on the representative value (median value) of each bin in the histogram.

FIG. 14 is a histogram of intermediate data that is obtained by application of the variable conversion to the number of occurrences of each bin in the histogram 300. The variable conversion is expressed in an equation of FIG. 15. Each intermediate data Ji after the application of the variable conversion is obtained by multiplying the number of occurrences Ni of the bin before the application of the variable conversion by a predetermined weight factor. Here, "i" indicates a bin number in FIGS. 13 and 14. Each weight factor is a value that is obtained by raising a quotient that is obtained by dividing the reference temperature by the representative value of the bin by the SN ratio. As shown in FIG. 14, the occurrence frequencies of the bins with large differences (the bins on the right side of the histogram in the drawing) are increased by the application of the variable conversion. This means that in a damage level calculated from the numbers of occurrences of the respective bins after the application of the variable conversion, the numbers of occurrences of the bins with the large differences impose a significant influence.

As another example of the application of the variable conversion, it may be a conversion that multiplies the number of occurrences of each bin by a constant that becomes larger as the difference becomes larger.

Figure 16:
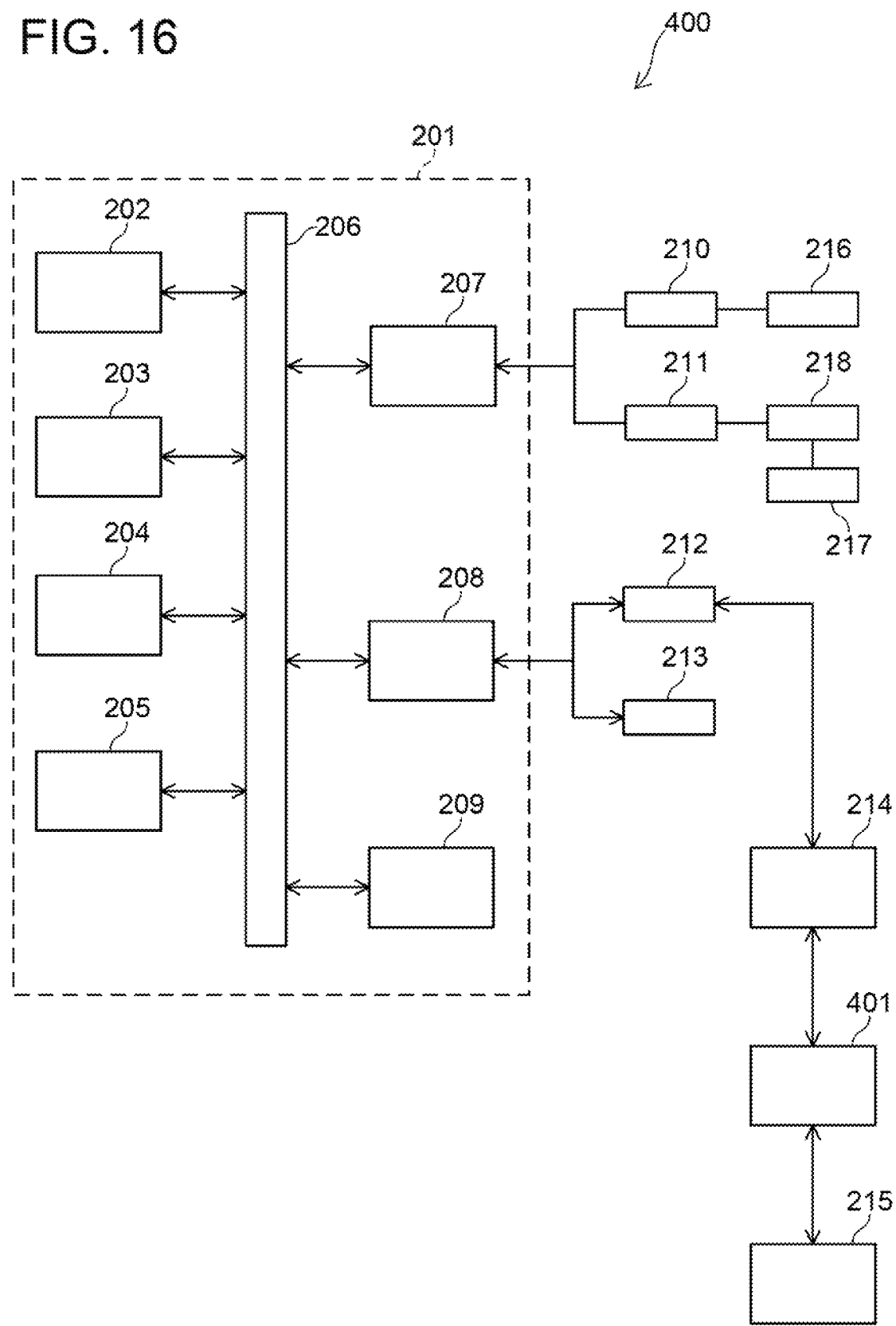
FIG. 16 is a block diagram of a failure prediction system of a variant.

(Variant) A variant of the failure prediction system 200 of FIG. 12 will be described. A block diagram of a failure prediction system 400 of the variant is shown in FIG. 16. The failure prediction system 400 of the variant differs from the failure prediction system 200 in that a statistical processing terminal 401 is provided between the external server 214 and the maintenance system 215. Other configurations of the failure prediction system 400 are the same as those of the failure prediction system 200. A machine learning terminal may be connected between the external server 214 and the maintenance system 215, instead of the statistical processing terminal 401. Alternatively, both the statistical processing terminal and the machine learning terminal may be connected between the external server 214 and the maintenance system 215.

Figure 17:
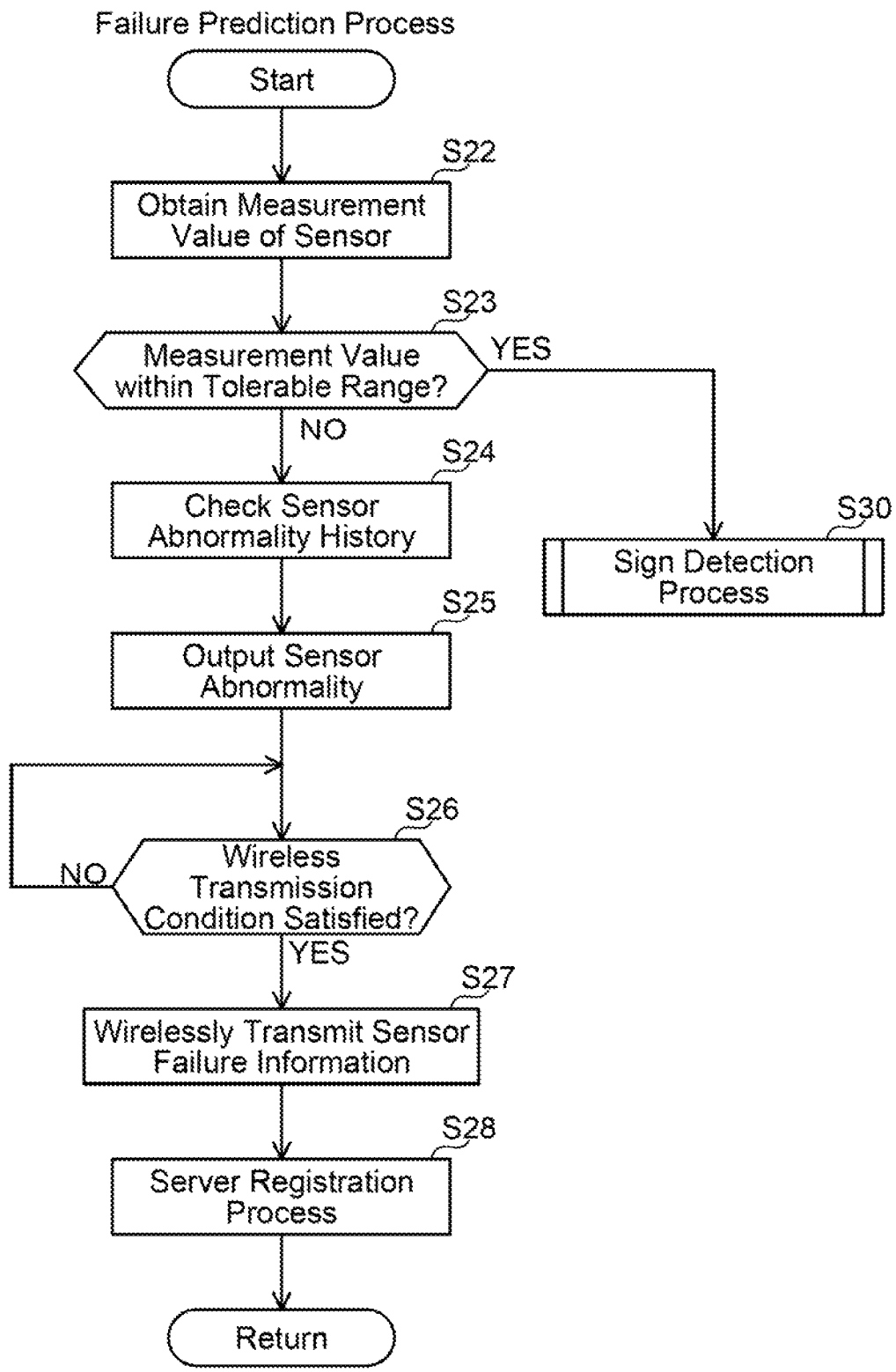
FIG. 17 is a flowchart of a failure prediction process.
Figure 18:
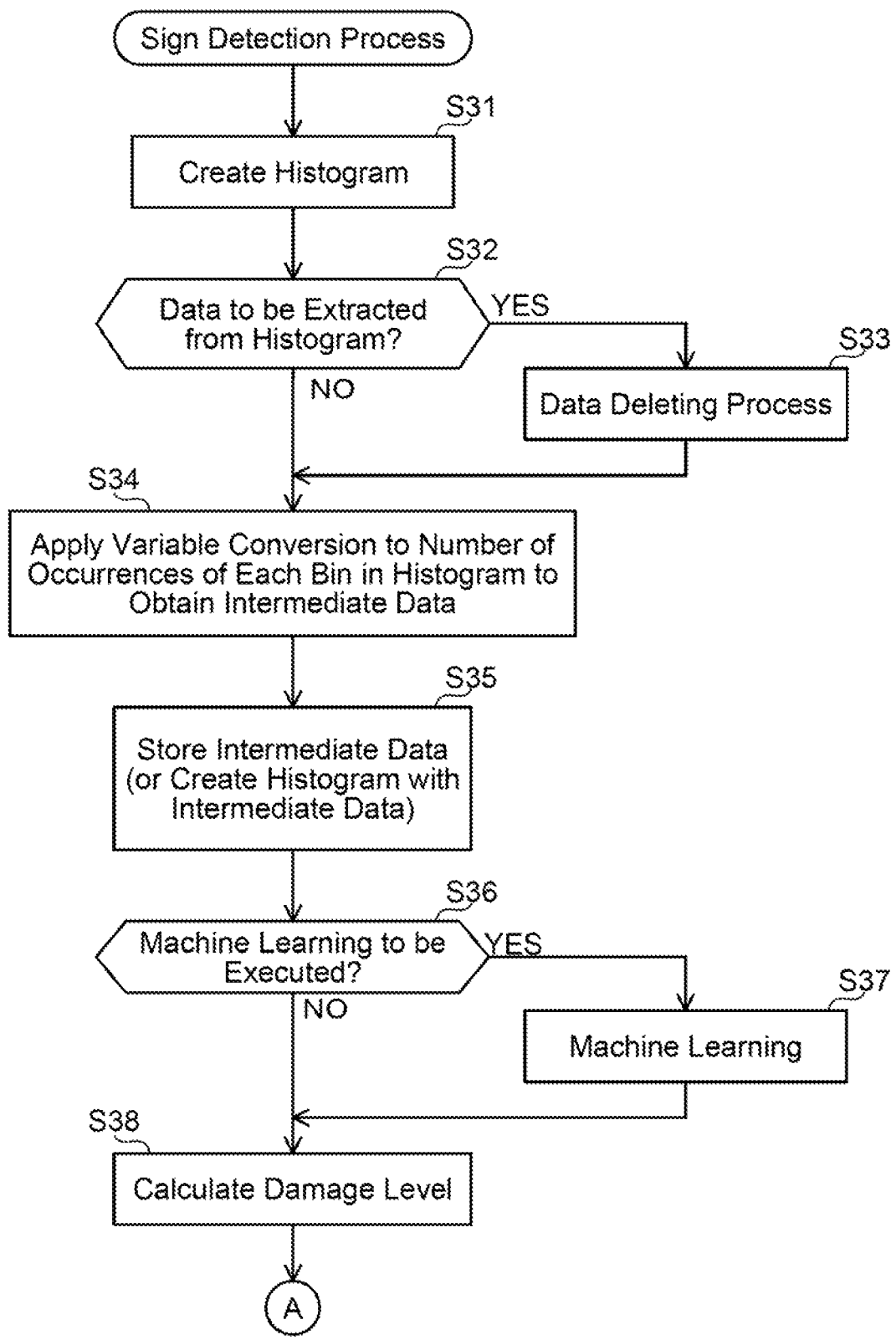
FIG. 18 is a flowchart (1) of a sign detection process.
Figure 19:
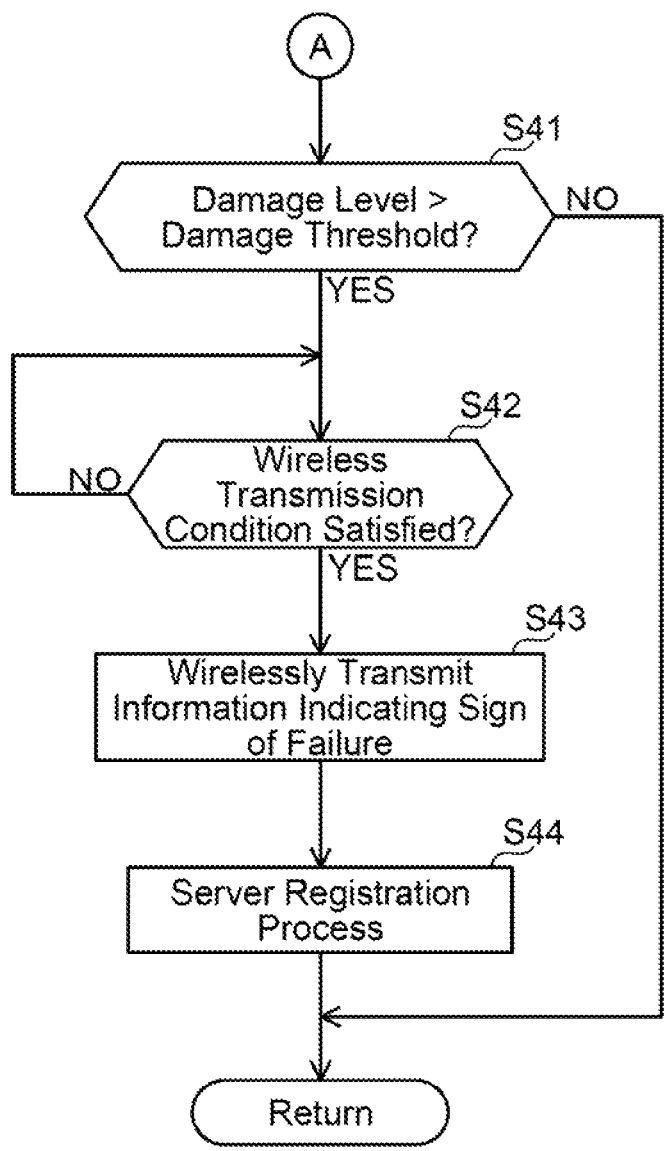
FIG. 19 is a flowchart (2) of the sign detection process.

(Process Executed by Controller) FIGS. 17 to 19 show flowcharts of a failure prediction process which the controller executes. The failure prediction process will be described following the flowcharts.

Firstly, the controller obtains a measurement value of the sensor (step S22). Then, the controller checks whether the measurement value is within a tolerable range (step S23). In a case where the measurement value is within the tolerable range (step S23: YES), the controller proceeds to execution of a sign detection process (step S30). The sign detection process will be described later.

In a case where the measurement value is not within the tolerable range (step S23: NO), it is highly likely that a failure is occurring in the sensor. The controller checks a sensor abnormality history (step S24). Then, the controller outputs a sensor abnormality (step S25). The controller waits until a wireless transmission condition is satisfied (step S26: NO). When the wireless transmission condition is satisfied, the controller wirelessly transmits sensor failure information (step S27). Finally, the controller executes a server registration process (step S28).

FIGS. 18 and 19 show the flowcharts of the sign detection process. In the sign detection process, the controller creates a histogram based on the measurement value obtained in step S22 (present measurement value) (FIG. 17) and the previous measurement value (step S31). Then, the controller determines whether or not to extract data from the histogram (step S32). In a case of extracting data (step S32: YES), the controller executes a data deleting process (step S33) and proceeds to a process of step S34.

In a case of not extracting data from the histogram, the controller skips S33 and proceeds to the process of S34 (step S32: NO, S34). In step S34, the controller applies the variable conversion to the number of occurrences of each bin in the histogram to generate intermediate data. Then, the controller determines whether or not to execute machine learning (step S36). In a case where the determination of step S36 is YES, the controller executes the machine learning (step S37) and proceeds to a process of step S38. In a case where the determination of step S36 is NO, the controller skips step S37 and proceeds to the process of step S38.

In step S38, the controller calculates a damage level based on the intermediate data. Then, the controller compares the damage level to a damage threshold (FIG. 19, step S41). In a case where the damage level does not exceed the damage threshold (step S41: NO), the controller terminates the process. In a case where the damage level exceeds the damage threshold (step S41: YES), the controller determines that a sign of failure is present. That is, the controller detects a sign of failure. In the case where the damage level exceeds the damage threshold (step S41: YES), the controller waits until the wireless transmission condition is satisfied (step S42: NO). When the wireless transmission condition is satisfied (step S42: YES), the controller wirelessly transmits information indicating that the sign of failure is present (step S43). Finally, the controller executes the server registration process (step S44).

The processes up to step S31 may be executed by an in-vehicle computer, and the processes from step S32 may be executed by a computer outside the vehicle. That is, a part of the failure prediction process may be realized by the in-vehicle computer and remaining parts of the failure prediction process may be realized by the computer (server) outside the vehicle. In other words, the controller of the failure prediction system may be constituted of the in-vehicle computer and the computer (server) outside the vehicle.

(Visualized Image of Damage Level) FIG. 20 shows an example of a screen on the display of the failure prediction system. FIG. 20 corresponds to the sign detection items shown in FIG. 11.

The screen example of FIG. 20 can be seen on a service terminal of the dealer who performs maintenance work, an information management system of the automobile manufacturer or supplier, and user's personal computer or smart device.

There are the following display types as examples of how the damage level is displayed: (1) The damage level is expressed in indication of normal or abnormal. (2) The damage level is expressed in a level ranging from 1 to 10. (3) The damage level is expressed in indication of severe, moderate, or trivial. (4) The damage level is expressed in indication of OK or NG. (5) The damage level is expressed in a color such as red, yellow, or green.

When the damage level exceeds the damage threshold, a sign detection is executed. A solid line L2 in FIG. 20 shows the damage threshold. The damage threshold is set based on a certain time period from a timing of failure, a distance the vehicle is capable of traveling, and an operating time of the vehicle.

A broken line L1 in FIG. 20 shows an in-advance management line. The in-advance management line (broken line L1) is a criterion for preventive maintenance that is set before the sign detection.

Aside from the items listed in FIG. 20, abnormalities regarding a water temperature of the cooler and an environmental temperature may be included.

For example, the following process may be executed on the items of FIG. 20 to quantify not only damages of the respective items for sign detection of failure but also a damage of a unit. Such a concept may be applied not only to quantification of a specific unit, but to quantification of damages of other units and the entire vehicle. The quantification of damages enables appropriate value evaluation in regard to values of the vehicle and the units.

Figure 21:
FIG. 21 is a diagram (1) explaining a process after a damage level has exceeded a damage threshold.
Figure 22:
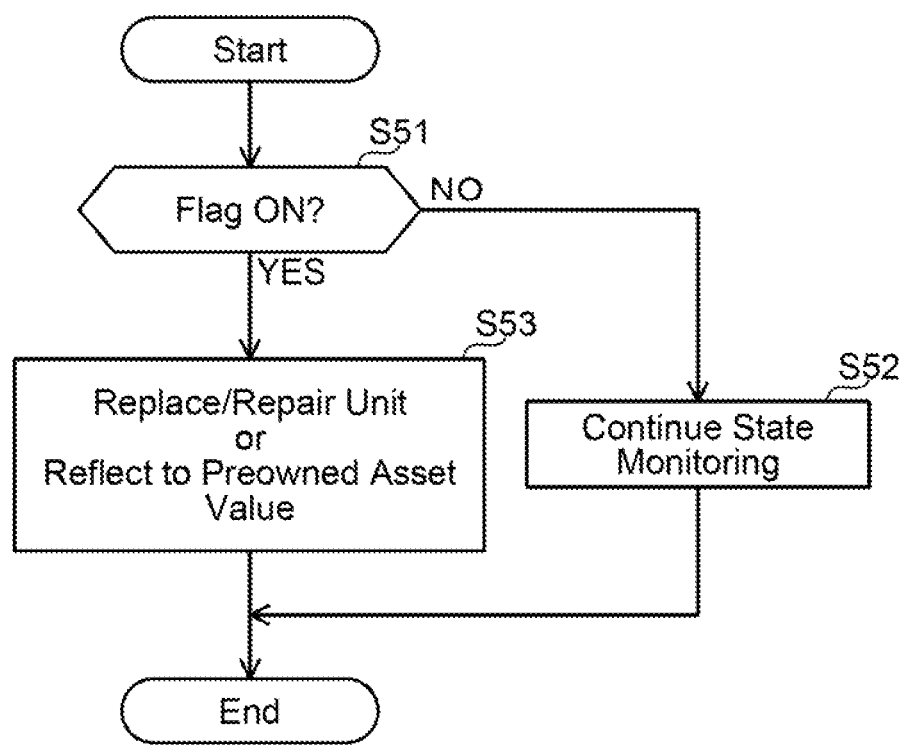
FIG. 22 is a diagram (2) explaining the process after a damage level has exceeded the damage threshold.

(Process Executed after Damage Level has Exceeded Damage Threshold) A process executed after the damage level has exceeded the damage threshold will be described with reference to FIGS. 21 and 22. FIG. 21 is the same as the screen example of FIG. 20. In the example of FIG. 21, the damage level exceeds the damage threshold (line L2) regarding the deterioration, quality change, and defects in the heat dissipating material. In this case, a sign detection flag (flag (A)) is set to ON. A confirmation process of the sign detection flag is shown in FIG. 22. In a case where the sign detection flag is not ON, a state monitoring is continued (step S51: NO, S52). In a case where the sign detection flag is ON, replacement or repair of the unit is performed. Alternatively, in the case where the sign detection flag is ON, the damage level is reflected on a preowned asset value (step S53).

Next, an example of process executed in a case where the damage levels have exceeded the damage threshold in a plurality of sign detection items will be described. FIG. 23 is a display example where the damage levels have exceeded the damage threshold in a plurality of sign detection items in the screen example of FIG. 20. In the example of FIG. 23, the damage levels exceed the damage threshold in four items (namely, element deformation, change in element characteristics, wear of bonding material, and deterioration and quality change in heat dissipating material). The sign detection flag is switched to ON for each of the items of which damage levels exceed the damage threshold. In the example of FIG. 23, a flag corresponding to the item of element deformation is a flag (A), a flag corresponding to the item of change in element characteristics is a flag (B), a flag corresponding to the item of wear of bonding material is a flag (C), and a flag corresponding to the item of deterioration and quality change in heat dissipating material is a flag (D).

In the example of FIG. 23, as shown in FIG. 24, each flag is multiplied by its corresponding weight factor. A result of multiplying the flag (A) by a weight factor a is a score Aa. Similarly, a result of multiplying the flag (B) by a weight factor b is a score Bb. A result of multiplying the flag (C) by a weight factor c is a score Cc. A result of multiplying the flag (D) by a weight factor d is a score Dd. In this case, the controller adds up all the scores to calculate a total damage level. In a case where the total damage level does not exceed a predetermined threshold, the controller continues the state monitoring. In a case where the total damage level exceeds the predetermined threshold, the relevant unit(s) is replaced or repaired. Alternatively, in the case where the total damage level exceeds the predetermined threshold, the total damage level is reflected on the preowned asset value. A relationship between the total damage level and the asset value is set voluntarily.

The weight factors may voluntarily be changed, considering a degree of influence on a failure, difficulty of parts acquisition, and difficulty of maintenance. In the example of FIG. 24, the weight factors are multiplied by the flags to obtain the scores, however, a score calculation method may voluntarily be changed.

(Case of Using Damage Levels of All Sign Detection Items) A case of using the damage levels of all the sign detection items will be described with reference to FIGS. 25 and 26. FIG. 25 is the same as the screen example of FIG. 23. In the example of FIGS. 25 and 26, all the damage levels are used to calculate a total damage level regardless of whether or not the damage levels exceed the damage threshold (line L2). In FIG. 25, the damage levels are denoted as level (A) to level (I) respectively to distinguish these damage levels of the sign detection items.

As shown in FIG. 26, each level is multiplied by its corresponding weight factor. A result of multiplying the flag (A) by a weight factor a is a score Aa. Similarly, the levels (B) to (I) are multiplied by their weight factors to obtain scores Bb to Ii. The controller adds up all the scores to calculate a total damage level. In a case where the total damage level does not exceed a predetermined threshold, the controller continues the state monitoring. In a case where the total damage level exceeds the predetermined threshold, the relevant unit(s) is replaced or repaired. Alternatively, in the case where the total damage level exceeds the predetermined threshold, the total damage level is reflected on the preowned asset value.

(Case of Using Machine Learning in Sign Detection) Next, an example of using machine learning in the sign detection will be described. FIG. 27 is a display example in a case of using machine learning in the damage level determination. In the example of FIG. 27, the damage levels exceed the damage threshold in two items (element deformation and deterioration and change in quality of heat dissipating material), and the flags (A) and (B) have been switched to ON. As a rule to switch the flags (A) and (B) from OFF to ON, machine learning (such as One class SVM, PCA) may be used as exemplified in FIG. 28.

Determination on normality and abnormality may be made according to each of a plurality of machine leaning methods. In the example of FIG. 28, four methods (One class SVM, Isolation Forest, Local Outlier Factor, Elliptic Envelope) are employed.

Further, for further accuracy improvement, a comprehensive determination may be made by subjecting results of the respective methods to ensemble learning. A threshold on whether or not a sign of failure is present (that is, the damage threshold) may be specified by machine learning. Further, a range used in the calculation for the damage levels and a range that is not used therein may be specified from the plurality of past measurement values by machine learning.

(Process after Sign of Failure has been Detected) In a case where a sign of failure is detected, how much this model of vehicle accounts for an entire market (this market, such as area-wise or country-wise, is selected voluntarily) is calculated. For units or parts of which ratio is equal to or more than a certain level, production of the parts is ordered to a parts factory to shorten lead time of parts supply. Further, distribution arrangements may automatically be made to logistics department and logistics company.

Figure 29:
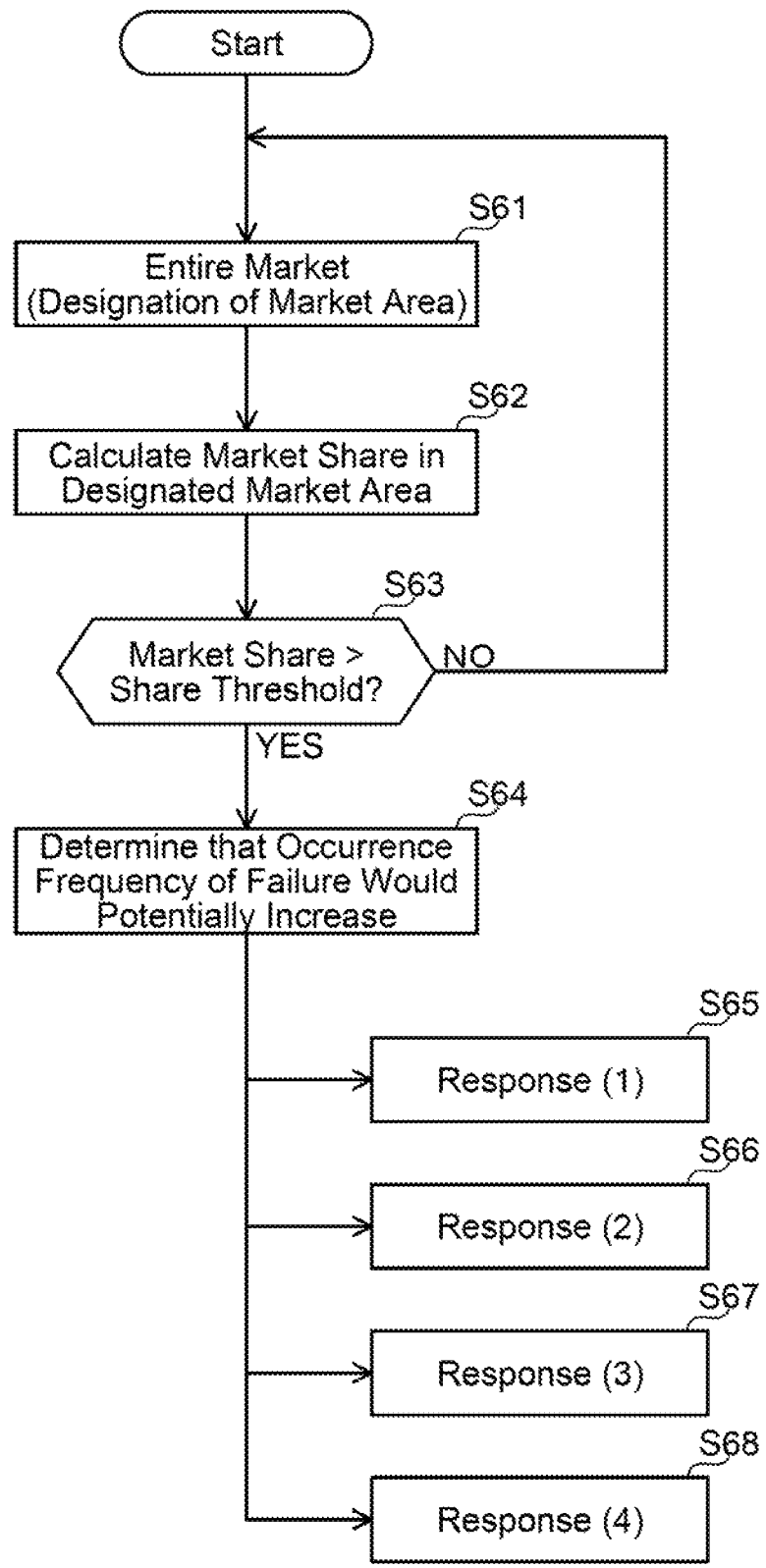
FIG. 29 is a diagram explaining an example of a process after a sign has been detected.

FIG. 29 shows an example of the process executed after a sign has been detected. Firstly, the entire market is selected or a market area is designated (step S61). Then, a market share in the designated market area is calculated (step S62). Next, the calculated market share is compared with a share threshold (step S63). In a case where the calculated market share does not exceed the share threshold (step S63: NO), the process returns to step S61 and another market area is designated.

In a case where the calculated market share exceeds the share threshold (step S63: YES), it is determined that an occurrence frequency of a failure would potentially increase (step S64). In this case, one or more of responses (1) to (4) are executed (steps S65 to S68). In the response (1), contacts are made with the dealer or the business owner to request inspection and maintenance. In the response (2), selection as an object of secondary use in the infrastructure or factory facility is made. In the response (3), reflection is made to production plans in production factories. In addition to the regular production, service target products may additionally be produced. In the response (4), reflection is made to logistics plans.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed.

Further, the purpose of the examples illustrated by the present description or drawings is to satisfy multiple objectives simultaneously, and satisfying any one of those objectives gives technical utility to the present disclosure.

What is claimed is:

1. A failure prediction system configured to predict a failure of a power converter which converts output power of a power source to power for driving a traction motor, the system comprising:
    a sensor provided at the power converter; and
    a controller configured to predict a failure of the power converter based on a measurement value of the sensor,
    wherein the controller is configured to:
        calculate a difference between a previous measurement value and a present measurement value of the sensor, wherein the controller repeatedly calculates the difference at predetermined time intervals;
        obtain intermediate data by applying variable conversion to a plurality of the past differences;
        calculate a damage level of the power converter based on the intermediate data; and
        output a warning signal in a case where the damage level exceeds a damage threshold, the warning signal indicating that a timing when the failure occurs is approaching, and
    the variable conversion includes:
    creating a histogram of the plurality of past differences;
    for each of bins in the histogram, multiplying a number of occurrences of the bin by a weight factor assigned to the bin; and
    obtaining the damage level by adding all products of the weight factors and the numbers of occurrences of the bins.

2. The failure prediction system of claim 1, wherein each of the weight factors is based on a value obtained by dividing a reference value assigned to corresponding one of the bins by a representative value of the bin.

3. The failure prediction system of claim 1, wherein the sensor is one of:
    a temperature sensor configured to measure a temperature of a switching element for power conversion provided in the power converter;
    a temperature sensor configured to measure a temperature of a cooling medium for a cooler which cools the switching element;
    a current sensor configured to measure current passing through the switching element; and
    a voltage sensor configured to measure a voltage of the switching element.

4. The failure prediction system of claim 1, further comprising a display configured to display that the timing when the failure occurs is approaching, in response to the warning signal.

5. The failure prediction system of claim 1, wherein the controller includes a local computer installed in a vehicle and a server located outside of the vehicle.

* * * * *